United States Patent [19]

Sayers

[11] Patent Number: 5,548,826
[45] Date of Patent: Aug. 20, 1996

[54] POWER AMPLIFIER AND A TRANSMITTER INCLUDING THE POWER AMPLIFIER

[75] Inventor: Anthony D. Sayers, Crawley, England

[73] Assignee: U.S. Philips Corporation, New York, N.Y.

[21] Appl. No.: 456,009

[22] Filed: May 30, 1995

Related U.S. Application Data

[63] Continuation of Ser. No. 116,479, Sep. 2, 1993, abandoned.

[30] Foreign Application Priority Data

Sep. 18, 1992 [GB] United Kingdom .................. 9219825

[51] Int. Cl.$^6$ ............................................. H04B 1/04
[52] U.S. Cl. ..................................... 455/126; 455/127
[58] Field of Search ........................... 330/279, 129, 330/138, 280; 455/115, 126, 127, 73, 84, 78, 82, 117; 370/77, 95.3

[56] References Cited

U.S. PATENT DOCUMENTS

| | | | |
|---|---|---|---|
| 3,689,752 | 9/1972 | Gilbert | 328/160 |
| 4,996,500 | 2/1991 | Larson et al. | 455/126 |
| 5,101,175 | 3/1992 | Vaisanen | 455/126 |
| 5,179,353 | 1/1993 | Miyake | 455/126 |
| 5,257,411 | 10/1993 | Minasi | 455/82 |
| 5,278,997 | 1/1994 | Martin | 455/127 |
| 5,369,789 | 11/1994 | Kosagi et al. | 455/126 |

FOREIGN PATENT DOCUMENTS

| | | |
|---|---|---|
| 0156398 | 10/1985 | European Pat. Off. . |
| 63-3517 | 1/1988 | Japan . |
| 2220808 | 1/1990 | United Kingdom . |
| 2236636 | 4/1991 | United Kingdom . |

OTHER PUBLICATIONS

B. Gilbert, IEEE Journal of Solid–State Circuits, vol. sc–3, No. 4, Dec. 1968, A Precise Four–Quadrant Multipilier With Subnanosecond Response.

*Primary Examiner*—Reinhard J. Eisenzopf
*Assistant Examiner*—Nguyen Vo
*Attorney, Agent, or Firm*—Edward Blocker

[57] ABSTRACT

A power amplifier suitable for use in n communication transmitter/transceiver which transmits bursts of signals in accordance with a TDD or TDMA protocol. Shaping the leading and trailing edges of the transmitted bursts is done using a feedback control loop around a substantially linear power amplifier (22). A modulated signal to be amplified is multiplied by an output of the control loop using a multiplier (28) and the product is applied to the power amplifier (22). A portion of the amplified signal is applied to a detector (38), the output of which is applied to one input of a difference amplifier (42), a second input of which receives a step-like reference signal of a predetermined amplitude. The difference signal produced is integrated (46) and low pass filtered (48) or vice versa, which slows down the difference signal to provide an output signal of the control loop which has the desired leading edge shape. No special waveform shaping circuitry is required to be connected to the second input of the difference amplifier (41).

12 Claims, 1 Drawing Sheet

5,548,826

POWER AMPLIFIER AND A TRANSMITTER INCLUDING THE POWER AMPLIFIER

This is a continuation of application Ser. No. 08/116,479, filed Sep. 2, 1993, now abandoned.

FIELD OF THE INVENTION

The present invention relates to a power amplifier and to a transmitter and to a transceiver including such a power amplifier. The power amplifier is suitable for use in transmitters or transceivers operating in accordance with the ETSI interim standard for DCS 1800 (Personal Communications Network).

BACKGROUND OF THE INVENTION

Time division duplex and time division multiple access protocols are frequently used in digital mobile and cordless communication systems in order to provide duplex channels on a single radio frequency carrier and in order to use a single rf carrier to provide many voice channels. One problem with such protocols is that as the radio frequency signal is switched on or off, the frequency spectrum of the signal momentarily widens which causes interference on adjacent radio frequency carriers. The momentary widening of the frequency spectrum is frequently known as "splatter".

In order to overcome or reduce this problem, the amplitude profile of the radio frequency carrier must be carefully shaped as the transmitter is switched on. This shaping is normally done in the power amplifier by coupling out a portion of the output signal, which after detection is compared with a reference signal and the difference is low pass filtered to form an "error" signal which is used to control the gain of the power amplifier. The reference signal which provides the shaping may be derived from a series of digital values which are read out from a ROM and which are applied to a digital to analogue converter. Such an arrangement is disclosed in FIG. 5 of UK Patent Specification GB-A-2 220 808. Whilst such known arrangements function satisfactorily they are relatively costly and consume power which is a disadvantage with battery powered equipment.

SUMMARY OF THE INVENTION

An object of the present invention is to simplify the amplitude profiling of the radio frequency carrier to avoid momentary widening of the frequency spectrum.

According to one aspect of the present invention there is provided a transceiver comprising transmitting means, receiving means and control means for controlling the operation of the transmitting and receiving means, the transmitting means comprising power amplifying means having an input for a signal to be amplified and an output for an output power signal and a control loop having means for sampling the output power signal, means for detecting the sampled output power signal, a reference control signal source, and means for comparing the detected sampled output power with the reference control signal, characterised in that the control loop further comprises means for integrating an output of the comparing means and low pass filtering means and in that there is provided multiplying means having first and second signal inputs and an output coupled to the input of the power amplifying means, a signal to be amplified being applied, in use, to the first signal input and the control loop being connected to the second input.

According to a second aspect of the present invention there is provided a transmitter comprising power amplifying means having an input for a signal to be amplified and an output for an output power signal and a control loop having means for sampling the output power signal, means for detecting the sampled output power signal, a reference control signal source, and means for comparing the detected sampled output power with the reference control signal, characterised in that the control loop further comprises means for integrating an output of the comparing means and low pass filtering means and in that there is provided multiplying means having first and second signal inputs and an output coupled to the input of the power amplifying means, a signal to be amplified being applied, in use, to the first signal input and the control loop being connected to the second input.

According to a third aspect of the present invention there is provided a power amplifier comprising power amplifying means having an input for a signal to be amplified and an output for an output power signal and a control loop having means for sampling the output power signal, means for detecting the sampled output power signal, a reference control signal source, and means for comparing the detected sampled output power with the reference control signal, characterised in that the control loop further comprises means for integrating an output of the comparing means and low pass filtering means and in that there is provided multiplying means having first and second signal inputs and an output coupled to the input of the power amplifying means, a signal to be amplified being applied, in use, to the first signal input and the control loop being connected to the second input.

By having a power control loop including a low pass filter, an integrator and a multiplier, the need for complex pulse shaping circuitry to shape the reference waveform is avoided. The control loop used in conjunction with the power amplifying means is able to make use of a step-like reference waveform of a predetermined value. Shaping of the amplified waveform is partly done in the integrating means which slows the output from the comparing means. The output from the integrating means is multiplied by the radio frequency input signal on the first input of the multiplying means which causes its output to rise slowly. The power amplifying means has sufficient linearity to assure that the slowly rising waveform appears on its output.

The low pass filtering means may be coupled between an output of the integrating means and the second input to the multiplying means or between an output of the comparing means and the input to the integrating means. An advantage of locating the low pass filtering means in either one of these positions is that it slows the integrated waveform so that the leading edge of the signal applied to the multiplying means rises gradually.

BRIEF DESCRIPTION OF THE DRAWINGS

The present invention will now be described, by way of example, with reference to the accompanying drawings, wherein.

DETAILED DESCRIPTION OF THE PREFERRED EMBODIMENTS

Figure 1:
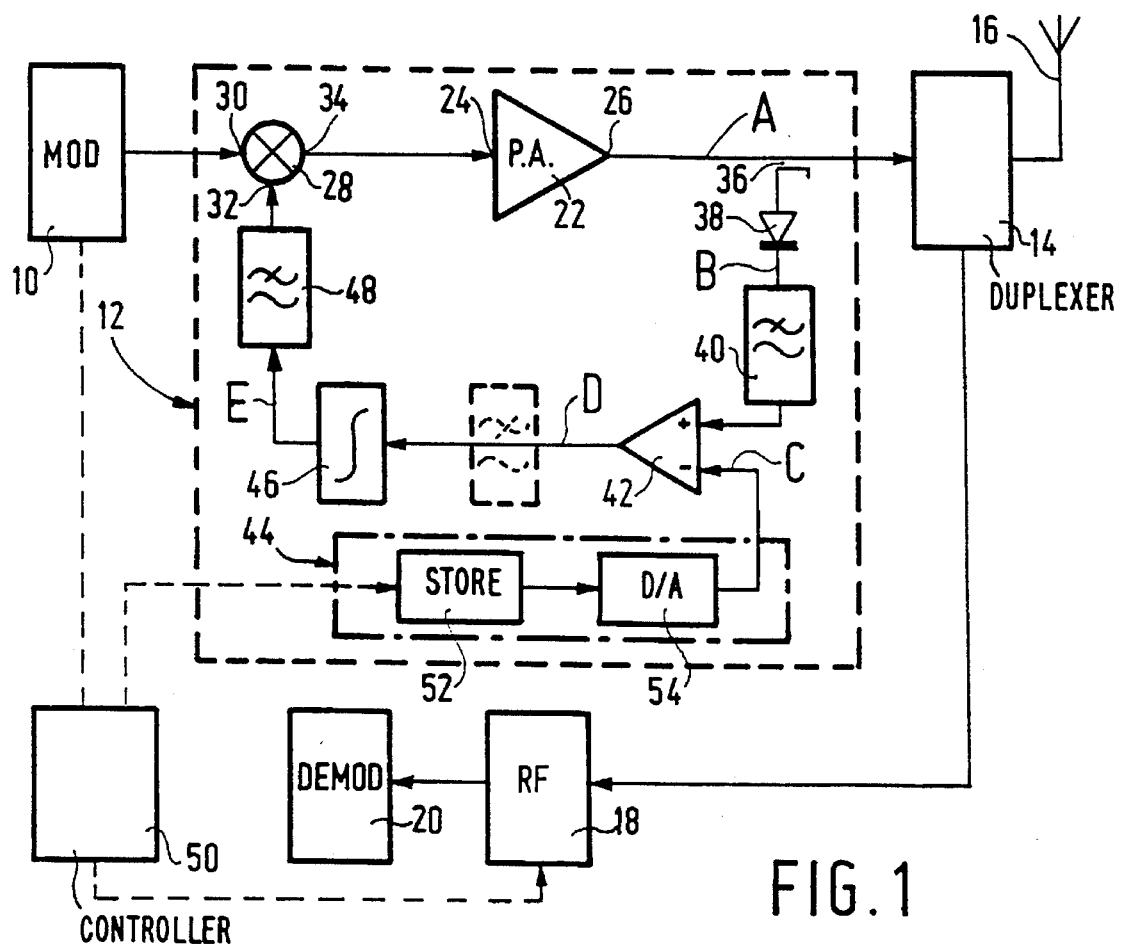
FIG. 1 is a simplified block schematic diagram of a transceiver comprising the power amplifier in accordance with the first aspect of the present invention.

The transceiver shown in FIG. 1 comprises a modulator 10 whose output is connected to a power amplifier circuit 12.

An output of the power amplifier circuit 12 is connected to a duplexer 14 which is connected to an antenna 16 for transmitting the amplified signal.

A signal received at the antenna is coupled by way of the duplexer 14 to an r.f. section 18 of a receiver in which the signal is frequency down converted and applied to a demodulator 20.

The power amplifier circuit 12 comprises a linear power amplifier 22 having an input 24 and an output 26 coupled to the duplexer 14. A multiplier circuit 28 is provided having first and second inputs 30,32 and an output 34. The first input 30 is connected to the modulator 10 and the output 34 is coupled to the amplifier input 24.

The amplifier circuit also includes a feedback control loop comprising a directional coupler 36 for coupling out a portion of the output from the power amplifier 22. A detector 38 is coupled to the directional coupler 36 for detecting the envelope of the output signal. A low pass filter 40 is connected to an output of the detector 38 and serves to remove wideband noise in the coupled out signal. The low pass filtered signal is applied to a non-inverting input of a comparator or differencing amplifier circuit 42. A reference or control signal source 44 is coupled to an inverting input of the differencing amplifier circuit 42. The control signal comprises a step function having a desired amplitude. An integrator 46 is coupled to an output of the amplifier circuit 42 for integrating the signal output of the amplifier circuit 42. An output of the integrator 46 is filtered in a low pass filter 48 and applied to the second input of the multiplier 28.

A controller 50 is provided for controlling the operation of the transceiver so that the transmitter and receiver sections are energised during the appropriate time slots of a TDMA frame and they are tuned to the required frequency if there are two or more channel frequencies available. The controller 50 is also responsible for setting dynamically the output power of the transmitter. Several methods are known per se. For example a base station may send output power control messages to a portable/mobile unit and/or the transceiver may include means for obtaining a radio signal strength indication (RSSI) from a received signal and for adjusting its own output power in response. The reference or control signal source 44 may comprise a store 52 for storing digitally a number of predetermined power levels and a digital to analogue converter 54 for converting the digital value read-out from the store 52 in response to a suitable signal from the controller 50 into a step-like control voltage. The control voltage supplied to the comparator 42 does not have its leading and trailing edges shaped to conform to a predetermined envelope profile.

Figure 2:
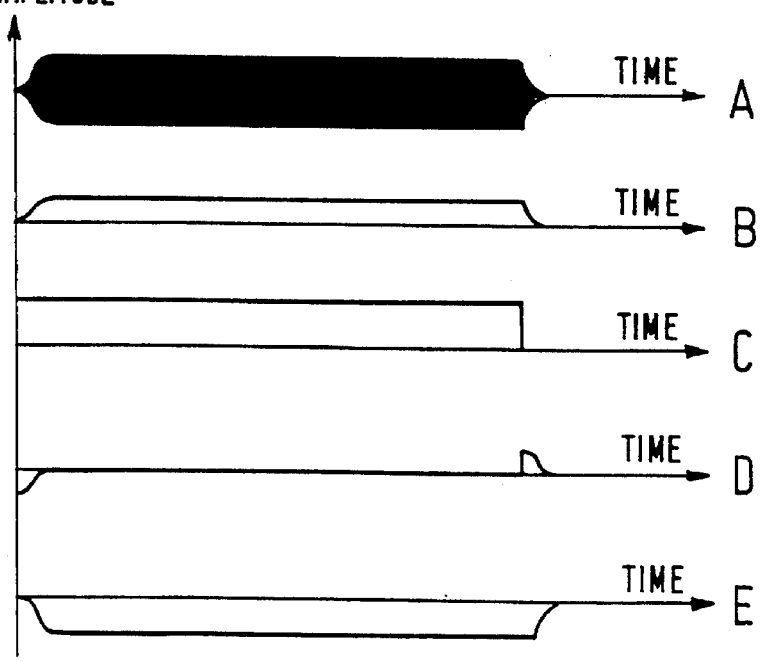
FIG. 2 shows waveforms occurring at different points in the circuit shown in FIG. 1.

Referring to FIG. 2, the waveform A comprises the power amplifier circuit output. It will be noted that the leading edge of the envelope rises gently somewhat like a raised cosine waveform. Waveform B is the envelope of the coupled out signal after detection. Waveform C is the step-like control signal produced by the source 44. It should be noted that the duration of the control signal is less than that of the detected signal. Waveform D comprises the output of the difference amplifier circuit 42. Finally waveform E comprises the output of the integrator 46. The step-like rising edge of the waveform D is slowed down by the integrator 46 and the low pass filter 48 thereby giving the desired profile to the leading edge of the waveform E without requiring special pulse shaping circuitry.

If desired the low pass filter 48 may be coupled between the output of the differencing amplifier circuit 42 and the input to the integrator 46, as shown in broken lines.

The multiplier 28 may comprise a four quadrant multiplier of a type described in the IEEE Journal of Solid State Circuits, Vol. SC-3, No. 4, December 1968, pages 365 to 372, "A Precise Four-Quadrant Multiplier with Subnanosecond Response" by Barrie Gilbert.

In the case of the power amplifier having to conform to the DCS 1800 specification, then in order for the control loop to meet section 05.05 of that specification, an integrator gain giving a loop time constant of 3.2 µs could be used. Additionally the low pass filter 48 may comprise a second order Butterworth low pass filter with a cut of frequency of 200 kHz. Finally the multiplier 28 would require a 30 dB dynamic range.

From reading the present disclosure, other modifications will be apparent to persons skilled in the art. Such modifications may involve other features which are already known in the design, manufacture and use of transmitters, power amplifiers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A transceiver for transmitting a signal burst at a predetermined carrier frequency only during a transmission time without significant momentary widening of the transmitted frequency spectrum at the beginning and ending of the transmission time, comprising transmitting means, receiving means and control means for generating a reference control signal corresponding to the transmission time for controlling the operation of the transmitting means, the reference control signal comprising a step function of a predetermined amplitude, the transmitting means comprising power amplifying means having an input for a signal to be amplified and an output for an output power signal and a control loop having means for sampling the output power signal, means for detecting the sampled output power signal, and means for comparing the detected sampled output power with the reference control signal, characterised in that the control loop further comprises means for integrating an output of the comparing means and low pass filtering means and in that there is provided multiplying means having first and second signal inputs and an output coupled to the input of the power amplifying means, a signal to be amplified being applied to the first signal input and the control loop being connected to the second input.

2. A transceiver as claimed in claim 1, characterised in that the low pass filtering means is coupled between an output of the integrating means and the second signal input of the multiplying means.

3. A transceiver as claimed in claim 2, characterized in that the multiplying means comprises a four-quadrant multiplier.

4. A transceiver as claimed in claim 1, characterised in that the low pass filtering means is coupled between an output of the comparing means and an input to the integrating means.

5. A transceiver as claimed in claim 4, characterized in that the multiplying means comprises a four-quadrant multiplier.

6. A transceiver as claimed in claim 1 characterised in that the multiplying means comprises a four-quadrant multiplier.

7. A transmitter for transmitting a signal burst at a predetermined carrier frequency only during a transmission time without significant momentary widening of the transmitted frequency spectrum at the beginning and ending of the transmission time, comprising power amplifying means having an input for a signal to be amplified and an output for an output power signal and a control loop having means for sampling the output power signal, means for detecting the sampled output power signal, a reference control signal source for producing a reference control signal corresponding to the transmission time, the reference control signal comprising a step function of a predetermined amplitude, and means for comparing the detected sampled output power with the reference control signal, characterised in that the control loop further comprises means for integrating an output of the comparing means and low pass filtering means and in that there is provided multiplying means having first and second signal inputs and an output coupled to the input of the power amplifying means, a signal to be amplified being applied to the first signal input and the control loop being connected to the second input.

8. A transmitter as claimed in claim 7, characterised in that the low pass filtering means is coupled between an output of the integrating means and the second signal input of the multiplying means.

9. A power transmitter for transmitting a signal burst at a predetermined carrier frequency only during a transmission time without significant momentary widening of the transmitted frequency spectrum at the beginning and ending of the transmission time, comprising power amplifying means having an input for a signal to be amplified and an output for an output power signal and a control loop having means for sampling the output power signal, means for detecting the sampled output power signal, a reference control signal source for producing a reference control signal corresponding to the transmission time, the reference control signal comprising a step function of a predetermined amplitude, and means for comparing the detected sampled output power with the reference control signal, characterised in that the control loop further comprises means for integrating an output of the comparing means and low pass filtering means and in that there is provided multiplying means having first and second signal inputs and an output coupled to the input of the power amplifying means, a signal to be amplified being applied to the first signal input and the control loop being connected to the second input.

10. A power amplifier for a radio frequency transmitter in which a signal is transmitted with a radio frequency carrier during a transmission time and momentary widening of the transmitted frequency spectrum at the beginning and end of the transmission time is to be avoided, comprising:

a power amplifier stage having an input for a signal to be amplified and an output for an output power signal;

a sampler for sampling the output power signal to produce a sampled output power signal;

a reference control signal source for supplying a reference control signal having a step function corresponding to the transmission time;

a comparator for producing a difference between the sampled output power signal and the reference control signal;

an integrator and low frequency filter responsive to the difference produced by the comparator to produce a shaped control signal; and a multiplier for multiplying the shaped control signal and the signal to be transmitted as the input to the power amplifier stage.

11. A power amplifier for a radio frequency transmitter in which a signal is transmitted with a radio frequency carrier during a transmission time and momentary widening of the transmitted frequency spectrum at the beginning and end of the transmission time is to be avoided, comprising:

a power amplifier stage having an input for a signal to be amplified and an output for an output power signal;

a sampler for sampling the output power signal to produce a sampled output power signal;

a reference control signal source for supplying a reference control signal having a step function corresponding to the transmission time;

a comparator for producing a difference between the sampled output power signal and the reference control signal;

circuit means comprising an integrator and low frequency filter for slowing changes in the difference produced by the comparator to produce a shaped control signal; and means responsive to the shaped control signal for controlling the effective gain of the power amplifier stage.

12. A power amplifier as defined in claim 11 wherein said means for controlling the effective gain of the power amplifier stage comprises a multiplier in the power amplifier stage for receiving and multiplying the input to the power amplifier stage by the shaped control signal.

* * * * *